United States Patent [19]
Andreasen et al.

[11] 3,935,479
[45] Jan. 27, 1976

[54] DYNAMIC DAMPING APPARATUS

[75] Inventors: John H. Andreasen, St. Paul; James A. Howe, Burnsville, both of Minn.

[73] Assignee: The United States of America as represented by the Secretary of the Air Force, Washington, D.C.

[22] Filed: Dec. 20, 1974

[21] Appl. No.: 535,061

[52] U.S. Cl. ............... 307/237; 307/264; 307/268
[51] Int. Cl.² ................................. H03K 5/08
[58] Field of Search ......... 307/237, 264, 268, 270; 323/1, 4, 8

[56] References Cited
UNITED STATES PATENTS

| | | | |
|---|---|---|---|
| 3,286,106 | 11/1966 | Deveson | 307/237 |
| 3,558,927 | 1/1971 | Whitehouse | 307/237 X |
| 3,705,333 | 12/1972 | Galetto et al. | 307/237 X |

Primary Examiner—John Zazworsky
Attorney, Agent, or Firm—Joseph E. Rusz; George Fine

[57] ABSTRACT

A dynamic damping apparatus wherein the current source is critically damped during rise and fall of current but the DC flattop of the current is unaffected by the fluctuations of load voltage. Therefore the output impedance of the current source is low during rise and fall times, but high during the flattop. This increases current source regulation.

2 Claims, 1 Drawing Figure

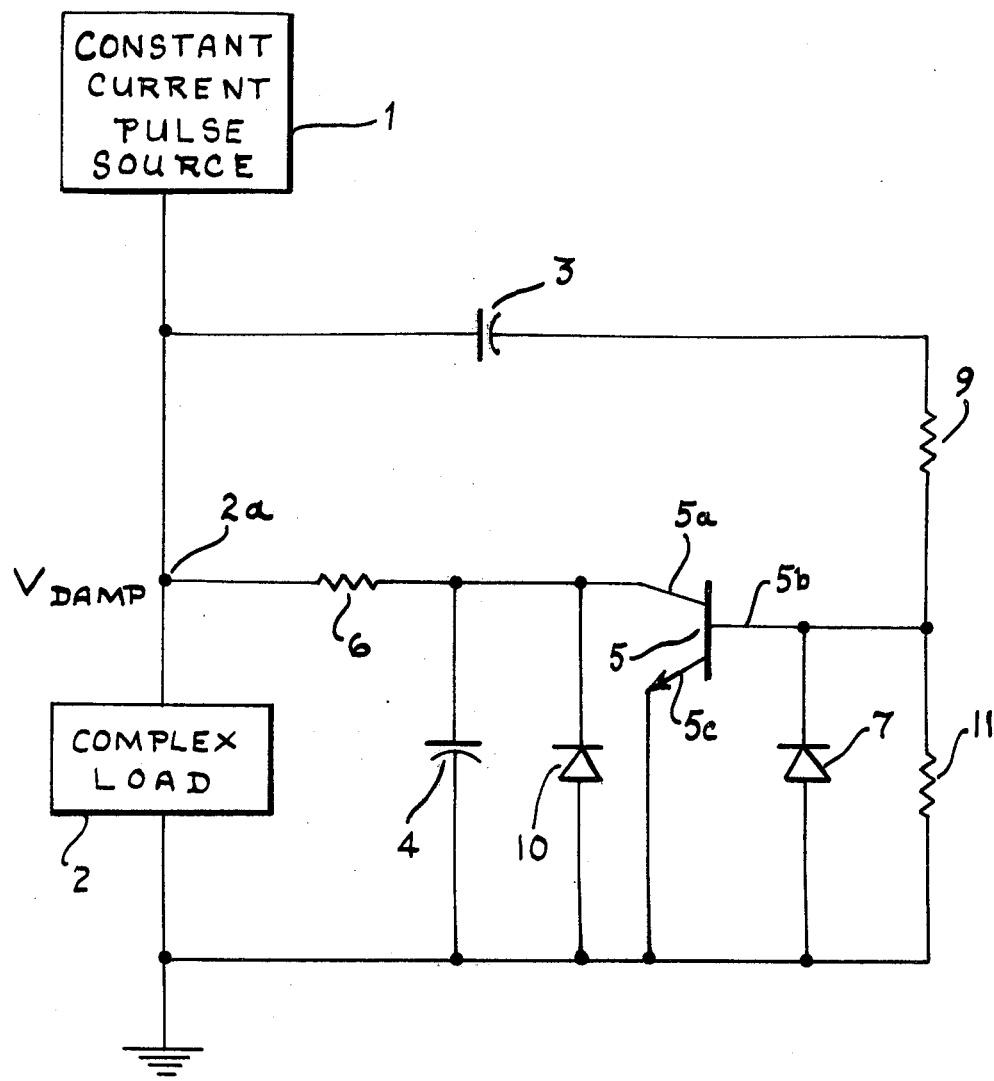

DYNAMIC DAMPING APPARATUS

STATEMENT OF GOVERNMENT INTEREST

The invention described herein may be manufactured and used by or for the Government for governmental purposes without the payment of any royalty thereon.

BACKGROUND OF THE INVENTION

A current source driving a complex load may require damping which lowers its output impedance. Damping is usually achieved by adding a parallel resistor to the output of a current source (parallel resonant circuit), and the output impedance of the current source is greatly reduced by the addition of the parallel resistor. Thus, variations in load voltage cause variations in current amplitude. The dynamic damping apparatus of the present invention eliminates this decrease in regulation by critically damping a constant current pulse driving a complex load during rise and fall times of the pulse.

SUMMARY OF THE INVENTION

A dynamic damping apparatus is provided. The current source is critically damped during the rise and fall of current but the current is not affected by voltage variation in the load during the flattop portion of the waveform.

DESCRIPTION OF THE DRAWINGS

The single FIGURE of the preferred embodiment of the dynamic damping apparatus is illustrated partly in diagrammatic and partly in block form.

Now referring in detail to the single FIGURE, there is shown conventional current source 1 which provides constant current pulses utilized to drive complex load 2. The current is damped during rise and fall of the current, but because of capacitors 3 and 4 the current is not affected by voltage variation in load 2 during the flattop portion of the constant current pulse waveform.

During rise time of current, $V_{DAMP}$ (load voltage) at input terminal 2a increases due to the inductive voltage transient across load 2. The voltage is coupled through capacitor 3 and used to drive transistor 5 into saturation. As $V_{DAMP}$ reaches its peak and starts to decline transistor 5 receives off drive from capacitor 3. As transistor 5 shuts off, capacitor 4 charges through resistor 6 to the DC value of the load. Thus, small signal voltage excursions of the load are damped by resistor 6 via the AC coupling to ground through capacitor 4, and the DC current through resistor 6 is zero. This gives the current source a high output impedance during the flattop portion.

Damping of the negative transient during the fall time of the current pulse is automatic when diode 10 forward biases due to the negative voltage transient across the load. Diode 7 prevents the negative swing from breaking down the base-emitter junction of transistor 5.

Since transistor 5 is driven by the damping voltage itself no critical timing is required since transistor 5 will automatically follow the damping waveform.

Additional damping is provided by resistor 9 via the AC coupling through capacitor 3 and one of the three following paths to ground: through the base of transistor 5 (positive transients), diode 7 (negative transients), and resistor 11 (flattop).

The damping apparatus components detailed hereinafter are for critically damping the Air Force Minuteman word current source load. With a different complex load different component values will be required for critically damping. Thus, resistor 6 interconnecting load 2 and collector 5a of transistor 5 is 82.5 ohms. Capacitor 3 is in series with resistor 9. The series arrangement interconnects load 2 and base 5b of transistor 5. Capacitor 3 is valued at 100 pf and resistor 9 at 75 ohms. Capacitor 4 and diode 10 are connected between collector 5a of transistor 5 and ground. Capacitor 4 is valued at 270 pf. Emitter 5c of transistor is connected to ground. Base 5b of transistor 5 is connected to ground by way of resistor 11 and diode 7. Resistor 11 carries the value of 499 ohms.

What is claimed is:

1. Dynamic damping apparatus being comprised of a source of constant current pulses, a complex load having an input terminal and receiving said constant current pulses thereat, first, second, and third preselected resistors, each having a different predetermined resistive value, a first and second preselected capacitor, each having a different predetermined capacitive value, a transistor having an emitter, collector, and base, said emitter being connected directly to ground, said collecter being connected to said input terminal by way of said first resistor and to ground by way of said first capacitor, said base being connected to said input terminal by way of a series arrangement of said second capacitor and said second resistor, and also connected to ground by way of said third resistor, and a first diode connecting said base to ground, the current being damped during the rise and fall of the current with the current being unaffected by voltage variation of said complex load during the flattop portion of the constant current pulses.

2. Dynamic damping apparatus as described in claim 1 further including a second diode connected between said collector of said transistor and ground.

* * * * *